United States Patent [19]

Kashima et al.

[11] Patent Number: 5,080,276
[45] Date of Patent: Jan. 14, 1992

[54] MOTOR-DRIVING CIRCUIT AND WIRE-BONDING APPARATUS

[75] Inventors: Noriyasu Kashima; Mutsumi Suematsu, both of Yokohama; Kazumi Ohtani, Fujisawa; Koichiro Atsumi, Yokohama, all of Japan

[73] Assignee: Kabushiki Kaisha Toshiba, Kawasaki, Japan

[21] Appl. No.: 499,680

[22] Filed: Mar. 27, 1990

[30] Foreign Application Priority Data

Mar. 27, 1989 [JP] Japan .................. 1-74521

[51] Int. Cl.$^5$ .................. B23K 20/00; H05K 13/06
[52] U.S. Cl. .................. 228/4.5; 228/8
[58] Field of Search .................. 228/4.5, 8, 45, 904, 228/102, 179

[56] References Cited

U.S. PATENT DOCUMENTS

| | | | |
|---|---|---|---|
| 3,937,974 | 2/1976 | Lafuze | 290/46 |
| 4,340,166 | 7/1982 | Bilane et al. | 228/179 |
| 4,364,111 | 12/1982 | Jocz | 364/175 |
| 4,510,422 | 4/1985 | Ogura | 318/254 |
| 4,565,957 | 1/1986 | Gary et al. | 318/723 |
| 4,743,825 | 5/1988 | Nashiki | 318/723 |
| 4,757,241 | 7/1988 | Young | 318/254 |

FOREIGN PATENT DOCUMENTS

| | | |
|---|---|---|
| 2035027 | 2/1971 | Fed. Rep. of Germany . |
| 58-24438 | 5/1983 | Japan . |
| 1-24931 | 7/1989 | Japan . |
| 2047596 | 12/1980 | United Kingdom . |
| 8701247 | 2/1987 | World Int. Prop. O. . |

*Primary Examiner*—Samuel M. Heinrich
*Attorney, Agent, or Firm*—Oblon, Spivak, McClelland, Maier & Neustadt

[57] ABSTRACT

A motor-driving circuit is used for driving a motor which is of a type including a rotor whose rotating shaft has a permanent magnet used for generating magnetic fluxes, and an armature having three-phase windings wound around an iron core to form Y-connection windings. The motor-driving circuit includes a circuit for short-circuiting two of the three leads extending from the Y-connection windings, a rotational position detector for detecting a rotational position of the motor, and a control circuit for causing an exciting an exciting current to flow between the short-circuited leads and the remaining lead, in such a manner that the rotational position detected by the rotational position-detecting means is moved to a designated rotational position which is external input and is within a narrow angular range.

4 Claims, 3 Drawing Sheets

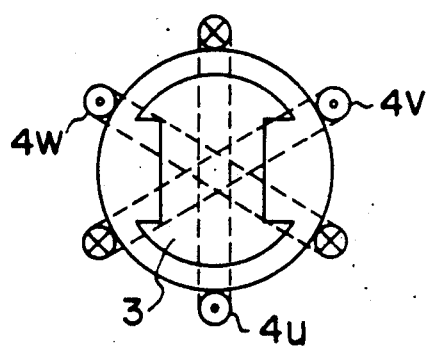
F I G. 2
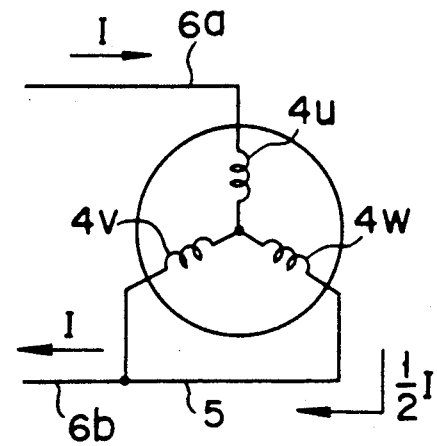
F I G. 3
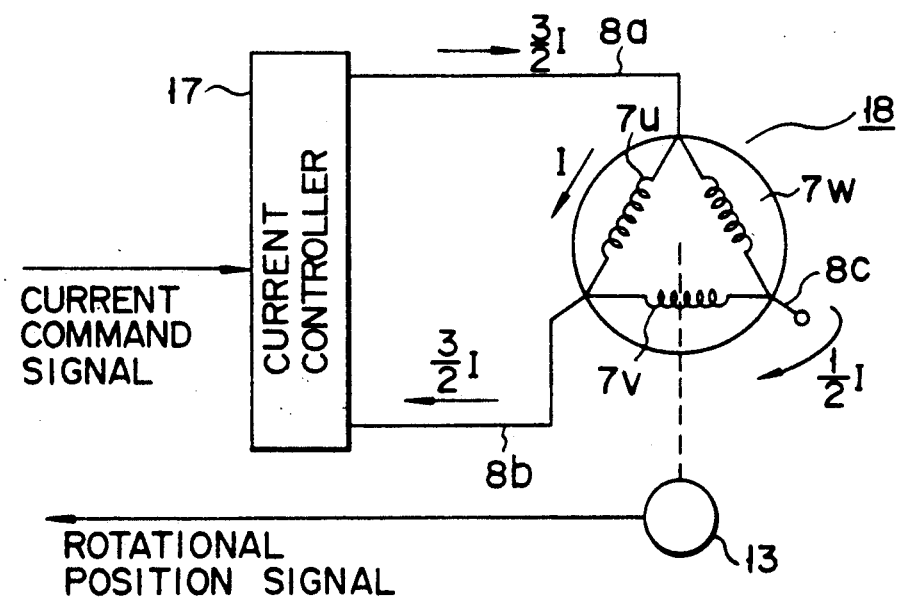
F I G. 4

MOTOR-DRIVING CIRCUIT AND WIRE-BONDING APPARATUS

BACKGROUND OF THE INVENTION

1. Field of the Invention

The present invention relates to a motor-driving circuit capable of controlling a rotational position of a motor in a very narrow angular range, and relates also to a wire-bonding apparatus incorporating the motor-driving circuit.

2. Description of the Related Art

In a brushless motor from which a rectifier is removed, a permanent magnet for generating magnetic fluxes is attached to the rotating shaft of a rotor, and three-phase windings are provided around the iron core of the stator.

As is well known, the torque produced by this three-phase motor is calculated as below.

Let it be assumed that the magnetic flux generated by the permanent magnet is $\phi$, and that the exciting currents iU, IV and iW flowing through the three-phase windings are respectively controlled to be sine-wave currents corresponding to the rotational position of the permanent magnet. In this case, the exciting currents iU, iV and iW are expressed as follows $iU = Ia \cdot \cos \theta r$
$iV = Ia \cdot \cos(\theta r - \frac{2}{3} \cdot \pi)$
$iW = Ia \cdot \cos(\theta r - 4/3 \cdot \pi)$ where $\theta r$ denotes the rotational position (angle) of the permanent magnet.

Thus, the torque produced by the motor is expressed by:

$$TM = 3/2 \cdot Ks \cdot Ia \cdot \phi$$

(Ks: a constant of proportionality)

As can be understood from the above, the torque TM produced by the motor is stable; it does not vary with a change in the rotational position of the motor.

As is well known, the three-phase windings of the motor include a Y-connection winding type and a Δ-connection winding type. In either type, the torque expressed by the above formula is produced, provided that the values of the exciting currents iU, iV and iW are maintained at the same values.

As mentioned above, a motor wherein a permanent magnet is provided for the rotor can be of a brushless type since it is not necessary to supply an exciting current to the rotor, as in a conventional DC servo motor wherein windings are provided for the rotor. However, a motor-driving circuit used for driving the brushless type of motor has to commutate the exciting currents iU, iV and iW to be supplied to the three-phase windings by use of transistor switches, with the rotational angular position of the rotor being constantly detected. Since, therefore, the circuit arrangement of this motor-driving circuit is inevitably complicated, the motor-driving circuit is larger in size than a conventional DC servo motor-driving circuit. In addition, the motor-driving circuit requires a higher manufacturing cost.

In some types of motors, the rotating shaft is required to rotate within a very narrow angular range. The motor employed in a bonding apparatus is a typical example of such a motor. In the motor, a tool arm is perpendicularly attached to the rotating shaft of the motor, and the tip end of the tool arm is moved within a certain limited range in accordance with minute rotation of the motor, so as to perform a bonding operation for an integrated circuit.

This type of motor need not produce uniform torque in the entire angle range (·0° to ·360°). The motor satisfies its requirements if uniform torque, an accurate rotational position, and an accurate rotating speed are attained only within a narrow angular range (e.g., the angular range of ·0° to ±·5°).

Therefore, if a motor requiring such limited rotation is driven by use of a motor-driving circuit designed for a complete-rotation type motor, the motor cannot be driven at high efficiency.

SUMMARY OF THE INVENTION

An object of the present invention is to provide a motor-driving circuit which enables a motor to efficiently rotate within a narrow angular range, while ensuring predetermined torque, an accurate rotational position and rotating speed.

Another object of the present invention is to provide a wire-bonding apparatus which employs the motor and motor-driving circuit and which is small in size and can be manufactured at low cost.

To achieve these objects, the present invention provides a motor-driving circuit which is used for driving a motor made up of: a rotor whose rotating shaft has a permanent magnet for generating magnetic fluxes; and an armature having Y-connection three-phase windings provided around an iron core, and which comprises: a circuit for short-circuiting two of the three leads of the Y-connection windings; a rotational position detector for detecting a rotational position of the motor; and a control circuit for causing an exciting current to flow between the short-circuited two leads and the remaining lead such that the rotational position detected by the rotational position detector is moved to a rotational position externally designated within a narrow angular range.

The present invention also provides a motor-driving circuit which is used for driving a motor having Δ-connection three-phase windings and which comprises: a rotational position detector for detecting a rotational position of the motor; and a control circuit for opening one of the three leads of the Δ-connection windings and causing an exciting current to flow between the remaining two leads such that the rotational position detected by the rotational position detector is moved to a rotational position externally designated within a narrow angular range.

The present invention further provides a wire-bonding apparatus which comprises: a motor made up of a rotor whose rotating shaft has a permanent magnet for generating magnetic fluxes and of an armature having Y-connection three-phase windings; a tool arm whose one end is provided with a capillary and whose another end is perpendicularly attached to the rotating shaft of the motor; and a motor-driving circuit for driving the motor such that the tool arm is minutely rotated to bring the capillary at the one end of the tool arm into contact with a bonding position, the motor-driving circuit including: a circuit for short-circuiting two of the three leads of the Y-connection windings; a rotational position detector for detecting a rotational position of the motor; and a control circuit for causing an exciting current to flow between the short-circuited two leads and the remaining lead such that the rotational position detected by the rotational position detector is moved to a rotational position permitting the capillary to touch the bonding position.

In the wire-bonding apparatus of the present invention, the rotational range of the tool arm corresponds to the shortest possible distance for which the capillary at the tip end of the tool arm moves until it touches the bonding position. Therefore, the motor having Y-connection windings whose two leads are short-circuited, is used for driving or rotating the tool arm. Accordingly, the rotation of the tool arm can be satisfactorily controlled by use of the motor-driving circuit.

In the wire-bonding apparatus of the present invention, the Y-connection winding motor may be replaced with a Δ-connection winding type motor. In this case, one of the three leads of the Δ-connection windings is kept open, and an exciting current is made to flow between the remaining two leads. By so doing, the rotation of the tool arm can be satisfactorily controlled, as in the wire-bonding apparatus mentioned above.

BRIEF DESCRIPTION OF THE DRAWINGS

FIG. 2 illustrates a motor to be driven by use of the motor-driving circuit of the first embodiment;

FIG. 3 is a circuit diagram corresponding to the motor shown in FIG. 2;

FIG. 4 is a circuit diagram showing the main portion of a motor-driving circuit according to the second embodiment of the present invention;

DETAILED DESCRIPTION OF THE PREFERRED EMBODIMENTS

A motor-driving circuit 11 of the first embodiment of the present invention will now be described, with reference to the accompanying drawings.

Figure 1:
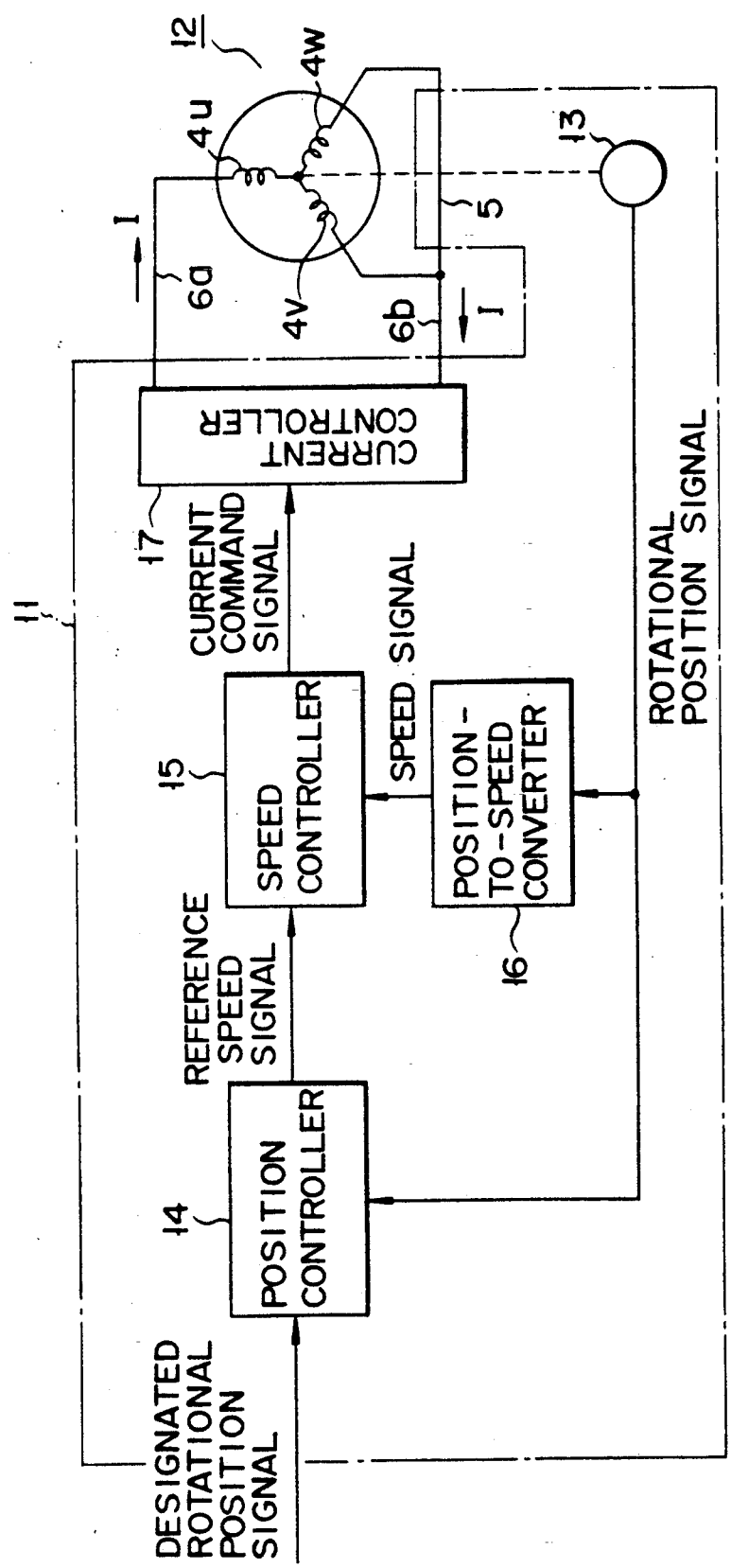
FIG. 1 is a block circuit diagram showing a motor-driving circuit according to the first embodiment of the present invention.

Referring to FIG. 1, the motor-driving circuit 11 is connected to a Y-connection winding type motor 12. The three-phase windings 4u, 4v and 4w of the motor 12 are of a Y-connection type, and the leads of windings 4v and 4w are short-circuited to each other by a short-circuiting line 5. Therefore, two leads 6a and 6b extend from the motor 12. A rotational position detector 13, constituted by a rotary encoder or the like, is connected directly to the rotating shaft of the motor, so as to detect a rotational position (i.e. a rotational angle).

As is shown in FIG. 1, a motor-driving circuit includes a position control circuit 14, a speed control section 15, a position-to-speed conversion circuit 16, and a current control circuit 17, in addition to the rotational position detector 13 mentioned above. The position control circuit 14 compares an externally-input rotational position signal with a rotational position signal supplied from the rotational position detector 13, and supplies the speed control section 15 with a reference speed signal corresponding to the difference between the two rotational position signals. The speed control circuit 15 compares this reference speed signal with a speed signal which the position-to-speed conversion circuit 16 produces by converting the rotational position signal input thereto from the rotational position detector 13. After the comparison, the speed control circuit 15 supplies the current control circuit 17 with a current command signal corresponding to the difference between the two signals. Upon receipt of the current command signal, the current control circuit 17 produces a d.c. exciting current having a value corresponding to the current command signal and causes the d.c. exciting current to flow between leads 6a and 6b of the motor 12.

Next, a description will be given of the principle of the torque generation used for minutely rotating the motor within a narrow angular range.

Let it be assumed that a permanent magnet 3 for generating magnetic fluxes is attached to the rotating shaft of the rotor of the motor and three-phase windings 4u, 4v and 4w are provided around the iron core of the stator of the motor, as is shown in FIG. 2. As is shown in FIG. 3, the three-phase windings 4u, 4v and 4w are connected together in such a manner as to constitute Y-connection windings, and the leads of two of the three windings, e.g., the leads of windings 4v and 4w, are short-circuited to each other by the short-circuiting line 5. Therefore, two lead 6a and 6b extend from the motor.

With respect to the motor mentioned above, the rotational position in the state shown in FIG. 2 is defined as θr=0. When a current I is supplied to lead 6a, currents I, I/2 and I/2 flow through windings 4u, 4v and 4w, respectively. At this time, the torque defined as T0=K·I (K: a constant of proportionality) is produced by the motor.

If the rotational angle θr is varied, with current I maintained, then the torque T expressed below is produced by the motor.

$$T = T0 \cdot \cos \theta r \qquad (1)$$

Where the rotational angle θr is comparatively small, the value of cos |θr| can be regarded as being nearly equal to 1. Therefore, the torque I can be represented as below.

$$T \approx T0 = KI \qquad (2)$$

As can be understood from the above, the torque T varies in proportion to the value of the d.c. current flowing between leads 6a and 6b, so that it is possible to control the torque in a similar manner to that performed in a conventional servo motor.

Therefore, the motor can be rotated to an externally-designated rotational position by producing an exciting current which permits the rotational position detected by the detector 13 (the rotational position being regarded as an actual rotational position) to move to the externally-designated rotational position and by causing the exciting current to flow between two leads 6a and 6b.

In the case of a Δ-connection winding type motor, one of the three leads 8a, 8b and 8c respectively connected to the wirings 7u, 7v and 7w is kept open (for example, lead 8c is kept open), and in this state a current of 3I/2 is made to flow between the remaining leads 8a and 8b, as is shown in FIG. 4. By so doing, currents of I, I/2, and I/2 flow through windings 7u, 7v and 7w, respectively. Accordingly, the torque T produced by the Δ-connection winding type motor has a substantially similar characteristic to that of the torque of the Y-connection winding type motor shown in FIG. 3.

When the current control circuit 17 receives a current command signal, it outputs a d.c. exciting current I having a value corresponding to the current command signal and causes the exciting current to flow between leads 6a and 6b of the motor 12. Since, therefore, the torque T expressed by above-noted formula (2) is produced, the motor 12 rotates in the designated direction at the designated speed. In accordance with the rotation of the motor 12, the rotational position signal output from the rotational position detector 13 varies, so that the motor 12 rotates to the designated rotational position in response to the designated rotational position signal.

In the motor-driving circuit 11, the position control circuit 14, the speed control circuit 15, and the current control circuit 17 jointly constitutes a control circuit. This control circuit causes an exciting current to flow between leads 6a and 6b such that the motor 12 rotates to the rotational position externally designated within a narrow angular range.

As long as the rotational angular position of the motor is within a narrow range (e.g., within the range of $0°$ to $\pm 5°$), the formula (2) noted above is satisfied by employing the motor-driving circuit 11 shown in FIG. 1. Therefore, the rotational position and rotating speed of the motor 12 can be controlled with high accuracy. Thus, the motor driving circuit 11 of the present invention has a remarkably simplified circuit arrangement, in comparison with a conventional brushless motor-driving circuit which has to control the rotational angular position of the motor in the entire angular range of $0°$ to $360°$.

As can be understood from the above, the motor-driving circuit 11 of the present invention maintains the advantages of the conventional brushless motor-driving circuit. Nevertheless, it is small in size and light in weight, and can be manufactured at low cost.

A motor-driving circuit according to the second embodiment of the present invention will now be described, with reference to FIG. 4.

The position control circuit 14, the speed control circuit 15 and the position-to-speed conversion circuit 16 employed in the second embodiment are similar to those employed in the first embodiment, so that a description of them will be omitted herein.

In the second embodiment, the three-phase windings 7u, 7v and 7w of a motor 18 are connected together in such a manner as to constitute Δ-connection windings, and one of the three leads 8a, 8b and 8c connected to the windings 7u, 7v and 7w is kept open, and the remaining two leads 8a and 8b are connected to the current control circuit 17 of the motor-driving circuit.

When the current control circuit 17 of the motor-driving circuit supplies a d.c. exciting current of 3I/2 to the motor, currents of I, I/2, and I/2 flow through the windings 7u, 7v and 7w, respectively, as mentioned above. Accordingly, the torque T produced by the Δ-connection winding type motor has a substantially similar characteristic to that of the torque produced by the Y-connection winding type motor shown in FIG. 3. It is thus possible to achieve the advantages substantially similar to those of the Y-connection winding type motor 12.

Figure 5:
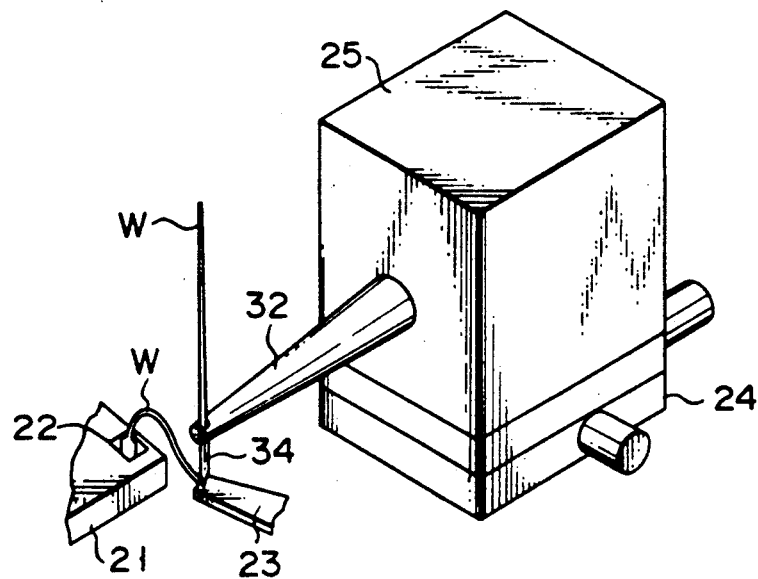
FIG. 5 is a perspective view of a wire-bonding apparatus according to an embodiment of the present invention.
Figure 6:
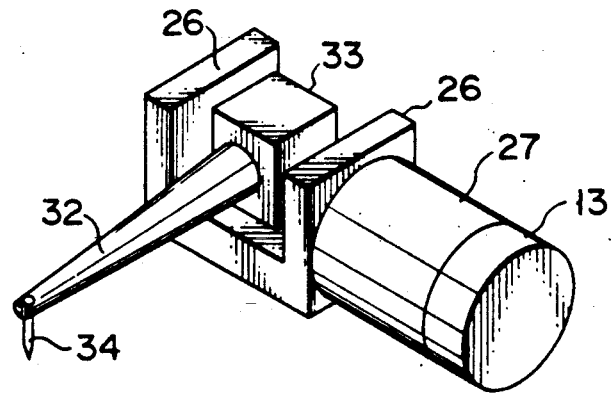
FIG. 6 is a perspective view of the rotary section of the wire-bonding apparatus shown in FIG. 5.
Figure 7:
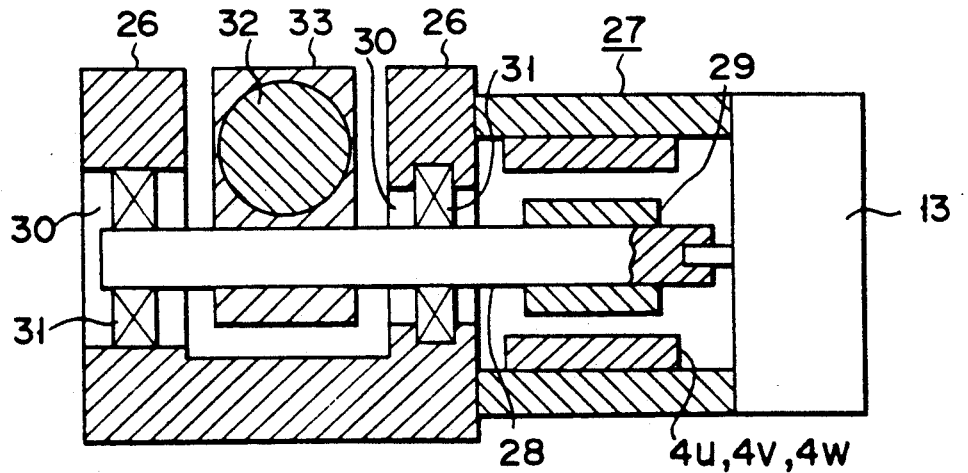
FIG. 7 is a sectional view of the rotary section shown in FIG. 6.

A wire-bonding apparatus according to an embodiment of the present invention will be now described, with reference to FIGS. 5 to 7.

The wire-bonding apparatus is an apparatus used in the manufacturing process of a semiconductor device, so as to provide a thin metal wire W between a lead frame 23 and an electrode 22 of an IC chip 21 by utilization of e.g., ultrasonic vibration. The bonding head 25 of the apparatus is mounted on an X-Y table 24.

The construction of this bonding head 25 will be described, with reference to FIGS. 5 and 7. As is shown in these Figures, a motor 27 is attached to one side of a frame 26 having a U-shaped cross section. A permanent magnet for generating magnetic fluxes is attached to the rotating shaft 28 of the motor 27. Three-phase windings 4u, 4v and 4w wound around an iron core are provided for a stator, which is located around the rotating shaft 28. The three-phase windings 4u, 4v and 4w are of a Y-connection type, such as that shown in FIG. 1, and the leads of windings 4v and 4w are short-circuited to each other. The motor 27 is driven by use of the motor-driving circuit 11 shown in FIG. 1.

One end of the rotating shaft 28 is coupled to a rotational position detector 13, while the other end thereof extend via through-holes 30 formed in the side walls of the frame 26 and is exposed. A bearing 31 for supporting the rotating shaft 28 is fitted and fixed in each through-hole 30. A fixing member 33 for fixing a tool arm 32 to the rotating shaft 28 is arranged inside the frame 26. The tool arm 32 extends perpendicular to the rotating shaft 28, with its one end held by the fixing member 33.

A capillary 34 is attached to the tip end of the tool arm 32. At the tip end of this capillary 34, a thin metal wire (W) is provided between an electrode 22 of the IC chip 21 and the lead frame 23 by utilization of ultrasonic vibration.

In the wire-bonding apparatus mentioned above, the X-Y table 24 is moved from one bonding position to another, in the state where the tip end of the capillary 34 is slightly raised from the lead frame 23. After the X-Y table is moved to the next bonding position, the capillary 34 is lowered to the bonding portion of the lead frame 23, for a bonding operation. Since the distance for which the capillary 34 is moved is very short, the angular range by which the rotating shaft 28 of the motor 27 should rotate is very narrow. Therefore, if the wire-bonding apparatus employs the motor-driving circuit 11 shown in FIG. 1 to drive the motor 27, it can be designed to be small in size and light in weight, without adversely affecting the bonding performance. In addition, the wire-bonding apparatus incorporating the motor-driving circuit 11 can be manufactured at a remarkably low cost.

The wire-bonding apparatus shown in FIGS. 5 to 7 employs a motor 27 whose three-phase windings 4u, 4v and 4w are of a Y-connection type. However, the apparatus may employ a motor whose three-phase windings are of a Δ-connection type, such as that shown in FIG. 4. Even in this case, the construction of the wire-bonding apparatus is similar to that of the above-mentioned wire-bonding apparatus, except for the use of the motor-driving circuit shown in FIG. 4.

Since the Δ-connection winding type motor 27 can be controlled to rotate minutely by employing the motor-driving circuit shown in FIG. 4, the wire-bonding apparatus incorporating the Δ-connection winding type motor 27 achieves the advantages similar to those of the aforesaid wire-bonding apparatus.

The motors employed in the foregoing embodiments are of a two-pole type, as is seen in FIGS. 2 and 3. However, the two-pole type motors may be replaced with multi-pole type motors, such as a four-pole type, an eight-pole type and a 12-pole type, as long as a torque variation of the multi-pole type motors is within a predetermined allowable range.

In the foregoing embodiments, a rotational position signal output from the rotational position detector 13 is converted into a speed signal by use of the position-to-speed conversion circuit 16. However, this conversion circuit 16 may be removed if a speed detector (e.g., a resolver) adapted exclusively for the detection of a rotating speed is employed.

In the wire-bonding apparatus mentioned above, the rotating shaft 28 of the motor 27 is supported by the bearings 30 fitted in the two side walls of the frame 26, and the tool arm 32 is fixed to the rotating shaft 28 at the central portion thereof and is a highly-rigid member. With this supporting structure, the rotating shaft hardly bends or vibrates. Thus, high-speed, highly-accurate wire bonding is enabled.

As mentioned above, when the motor-driving circuit of the present invention is used with a Y-connection winding type motor, two leads are short-circuited to each other. When it is used with a Δ-connection winding type motor, one of the leads is kept open, and a d.c. exciting current is made to flow between the remaining two leads. Therefore, the motor-driving circuit can employ a substantially similar circuit arrangement to that of a conventional DC servo motor-driving circuit. As a result, it has a simplified circuit arrangement and yet the advantages of the conventional brushless motor-driving circuit are maintained. In addition, the cost required for manufacturing such a motor-driving circuit can be remarkably reduced.

Moreover, a wire-bonding apparatus incorporating the above motor and motor-driving circuit has satisfactory bonding performance and is small in size and low in price.

What is claimed is:

1. A wire-bonding apparatus comprising:
   a motor having a rotating shaft;
   a tool arm unit including a tool arm whose one end is provided with a capillary and whose other end is perpendicularly attached to the rotating shaft of the motor;
   a motor-driving circuit for driving the motor by which the tool arm is rotated so that the capillary abuts a bonding position;
   said tool arm unit including:
   a frame attached to the motor and having two side walls opposed to each other, said side walls each having respective through holes;
   a pair of bearings fitted and fixed in the respective through holes of the side walls of the frame, for supporting the rotating shaft at two portions thereof; and
   a fixing member, located inside the frame, for fixing said another end of the tool arm to the rotating shaft.

2. A wire-bonding apparatus comprising:
   a motor made up of a rotor having a permanent magnet for generating magnetic fluxes, an armature having Y-connection three-phase windings, and a rotating shaft;
   a tool arm unit including a tool arm whose one end is provided with a capillary and whose other end is perpendicularly coupled to the rotating shaft of the motor, to thereby hold the capillary perpendicular to the rotating shaft; and
   a motor-driving circuit for rotating the motor within a narrow angular range such that the capillary contacts a bonding position;
   said tool arm unit including:
   a frame attached to the motor and having two side walls opposed to each other, said side walls each having respective through holes;
   a pair of bearings, fitted and fixed in the respective through holes of the side walls of the frame for supporting the rotating shaft at two portions thereof; and
   a fixing member, located inside the frame, for fixing said another end of the tool arm to the rotating shaft,
   said motor-driving circuit including:
   short-circuiting means for short-circuiting two of three leads extending from the Y-connection windings;
   a rotational position detector for detecting a rotational position of the motor; and
   a control circuit for causing an exciting current to flow between the short-circuited leads and the remaining lead such that the rotational position detected by the rotational position detector is moved to a rotational position.

3. A wire-bonding apparatus comprising:
   a motor including a rotor having a permanent magnet for generating magnetic fluxes, an armature having Δ-connection three-phase windings, and a rotation shaft;
   a tool arm unit including a tool arm whose one end has a capillary and whose other end is perpendicularly coupled to the rotating shaft of the motor, to thereby hold the capillary perpendicular to the rotating shaft;
   a motor-driving circuit for rotating the motor within a narrow angular range such that the capillary contacts a bonding position;
   said tool arm unit including:
   a frame attached to the motor and having two side walls opposed to each other, said side walls each having respective through holes;
   a pair of bearings, fitted and fixed in the through holes of the side walls of the frame, respectively, for supporting the rotating shaft at two portions thereof; and
   a fixing member, located inside the frame, for fixing said another end of the tool arm to the rotating shaft,
   said motor-driving circuit including:
   a rotational position detector for detecting a rotational position of the motor; and
   a control circuit for opening one of three leads extending from the windings and for causing an exciting current to flow between the remaining two leads such that the rotational position detected by the rotational position detector is moved to a rotational position designated externally.

4. A wire-bonding apparatus according to claim 1, wherein said motor-driving circuit drives said motor so that said motor is rotated within the narrow angular range of 0° to 5°.

* * * * *